(12) United States Patent
Hruska et al.

(10) Patent No.: US 12,041,325 B2
(45) Date of Patent: Jul. 16, 2024

(54) SCROLLING SPECTRAL FILTER (71) Applicant: VIAVI Solutions Inc., San Jose, CA (US)

(72) Inventors: Curtis R. Hruska, Cloverdale, CA (US); William D. Houck, Santa Rosa, CA (US)

(73) Assignee: VIAVI Solutions Inc., Chandler, AZ (US)

( * ) Notice: Subject to any disclaimer, the term of this patent is extended or adjusted under 35 U.S.C. 154(b) by 75 days.

(21) Appl. No.: 17/580,075

(22) Filed: Jan. 20, 2022

(65) Prior Publication Data
US 2022/0141428 A1   May 5, 2022

Related U.S. Application Data (63) Continuation of application No. 16/898,914, filed on Jun. 11, 2020, now Pat. No. 11,245,877.

(51) Int. Cl.
| | |
|---|---|
| *H04N 23/10* | (2023.01) |
| *G01N 21/31* | (2006.01) |
| *H01L 27/146* | (2006.01) |
| *H04N 1/48* | (2006.01) |
| *H04N 23/12* | (2023.01) |
| *H04N 25/11* | (2023.01) |

(52) U.S. Cl.
CPC ..... *H04N 23/125* (2023.01); *H01L 27/14621* (2013.01); *H04N 1/482* (2013.01); *H04N 23/12* (2023.01); *H04N 25/11* (2023.01); *G01N 2021/3174* (2013.01)

(58) Field of Classification Search
CPC ...... H04N 23/125; H04N 1/482; H04N 23/12; H04N 25/11; H01L 27/14621; G01N 2021/3174; G01J 2003/064; G01J 3/06; G01J 3/2803; G02B 26/008
See application file for complete search history.

(56) References Cited

U.S. PATENT DOCUMENTS

| | | | |
|---|---|---|---|
| 9,071,721 B1* | 6/2015 | D'Amico | H04N 23/125 |
| 9,654,745 B2 | 5/2017 | Zeng et al. | |
| 10,904,493 B2 | 1/2021 | Lundgren et al. | |
| 2004/0174522 A1 | 9/2004 | Hagler | |
| 2005/0030659 A1* | 2/2005 | Asakawa | G03B 11/00 |
| | | | 359/889 |
| 2011/0079714 A1 | 4/2011 | McEldowney et al. | |

(Continued)

FOREIGN PATENT DOCUMENTS

| | | |
|---|---|---|
| EP | 2749210 A1 | 7/2014 |
| EP | 2808661 A1 | 12/2014 |

OTHER PUBLICATIONS

Extended European Search Report for Application No. EP21173497. 5, dated Nov. 8, 2021, 10 pages.

(Continued)

*Primary Examiner* — Seung C Sohn
(74) *Attorney, Agent, or Firm* — Harrity & Harrity, LLP (57) ABSTRACT

A device including an array of pixels and a filter wheel may capture a plurality of images by exposing the array of pixels. The device may spin, while capturing the plurality of images, the filter wheel, and the filter wheel may include filter segments. In some implementations, a portion of the filter wheel in front of the array of pixels includes two or more filter segments.

20 Claims, 8 Drawing Sheets

(56) References Cited

U.S. PATENT DOCUMENTS

| | | |
|---|---|---|
| 2011/0242328 A1 | 10/2011 | Twede et al. |
| 2013/0038782 A1 | 2/2013 | Fish et al. |
| 2014/0354802 A1* | 12/2014 | Ohtomo ............... G02B 27/126 |
| | | 348/135 |
| 2021/0392302 A1 | 12/2021 | Hruska et al. |

OTHER PUBLICATIONS

Multi-Spectral Imaging Pixelteq's Spectrocam and Pixelcam cameras, Spectrecology—Spectroscopy & Optical Sensing Solutions, Apr. 2020, pp. 1-5.

* cited by examiner

SCROLLING SPECTRAL FILTER

RELATED APPLICATION

This application is a continuation of U.S. patent application Ser. No. 16/898,914, filed Jun. 11, 2020, which is incorporated herein by reference in its entirety.

BACKGROUND

An optical filter is a device that filters light, incident on the optical filter, based on wavelength. For example, a bandpass filter may transmit light in a particular range of wavelengths, while rejecting (e.g., absorbing or reflecting) light at wavelengths that fall outside of (e.g., above or below) the particular range of wavelengths. Bandpass filters may be used in a variety of applications, such as fluorescence microscopy, spectroscopy, clinical chemistry, imaging, and many others.

SUMMARY

According to some implementations, a method may include capturing, by a device including an array of pixels and a filter wheel, a plurality of images by exposing the array of pixels, and spinning, by the device and while capturing the plurality of images, the filter wheel, wherein the filter wheel includes filter segments, and wherein a portion of the filter wheel in front of the array of pixels includes two or more filter segments.

According to some implementations, a method may include capturing, by a device including an array of rows of pixels and a filter wheel, a plurality of images by sequentially exposing, at a shutter speed and in a rolling shutter mode, each row of pixels of the array, and spinning, by the device, while capturing the plurality of images, and at a wheel speed, the filter wheel, wherein the filter wheel includes filter segments, and wherein a portion of the filter wheel in front of the array includes two or more filter segments.

According to some implementations, a device may include an array of rows of pixels, a filter wheel including filter segments, wherein a portion of the filter wheel positioned in front of the array includes two or more filter segments, and one or more processors. The one or more processors may be configured to capture a plurality of images by exposing the array, and spin, while capturing the plurality of images, the filter wheel.

DETAILED DESCRIPTION

The following detailed description of example implementations refers to the accompanying drawings. The same reference numbers in different drawings may identify the same or similar elements.

Static spectral imaging uses multiple color regions or filters (e.g., bandpass filters) arranged in contact with or just above an imager including an array of pixels. The color regions or filters are arranged in a pattern which is repeated over the array of pixels. For example, a Red-Green-Blue (RGB) Bayer filter includes a pattern of two green filters, one blue filter, and one red filter placed over four pixels. The pattern is repeated across the array. However, because the pattern covers four pixels, spatial resolution of the imager is reduced by a factor of four. For example, a 1-megabit sensor (1,000 pixels×1,000 pixels) with an RGB filter has a spatial resolution of 250 kilobits. Furthermore, increasing a quantity of filter elements (e.g., to obtain greater spectral information with each image) further decreases spatial resolution of an imager.

Another method of capturing spectral and spatial information includes laying discrete filters side-by-side and moving the discrete filters linearly across an imaging field while capturing a single image. However, such a method requires an imager to, after capturing one image and before capturing another, reset an assembly of the discrete filters to a start location. Such a reset of the assembly of the discrete filters causes mechanical vibrations. Furthermore, a quantity of spectral filters that may be included in the assembly is physically limited. Additionally, such a method requires long image acquisition times (e.g., tens of seconds or minutes).

Some implementations described herein provide a method and/or a device that captures a plurality of images by exposing an array of pixels and, while capturing the plurality of images, spins a filter wheel positioned in front of the array of pixels. The filter wheel (e.g., a scrolling spectral imaging filter) includes filter segments (e.g., filter elements), and a portion of the filter wheel in front of the array of pixels includes two or more filter segments. The filter segments may be different types of filters to increase spectral resolution and may be positioned in the filter wheel in a repeating sequence. In some implementations, the filter segments may scroll across the array of pixels as the filter wheel spins.

In some implementations, the method and/or the device may capture the images in a rolling shutter mode by sequentially exposing, at a shutter speed, each row of pixels of the array of pixels. Additionally, or alternatively, the method and/or the device may spin the filter wheel at a wheel speed, where the wheel speed corresponds to the shutter speed such that, for an image of the plurality of images, a single filter segment of the filter segments is positioned in front of each exposed row of pixels. In some implementations, the method and/or the device may capture the images in a global shutter mode by simultaneously exposing pixels of the array of pixels.

In this way, the method and/or the device may increase spectral resolution without decreasing spatial resolution. By spinning the filter wheel, the method and/or the device may not suffer from mechanical vibrations. Additionally, or alternatively, a quantity of filters that may be included in the filter wheel may be as high as 100 or even more (e.g., 125 filter segments, 250 filter segments, 250 filter segments each including three or more subsegments, and/or the like). In some implementations, by spinning the filter wheel, the method and/or the device may have image acquisition times shorter than the image acquisition times achievable using a linearly scrolling assembly of filters.

Figure 1:
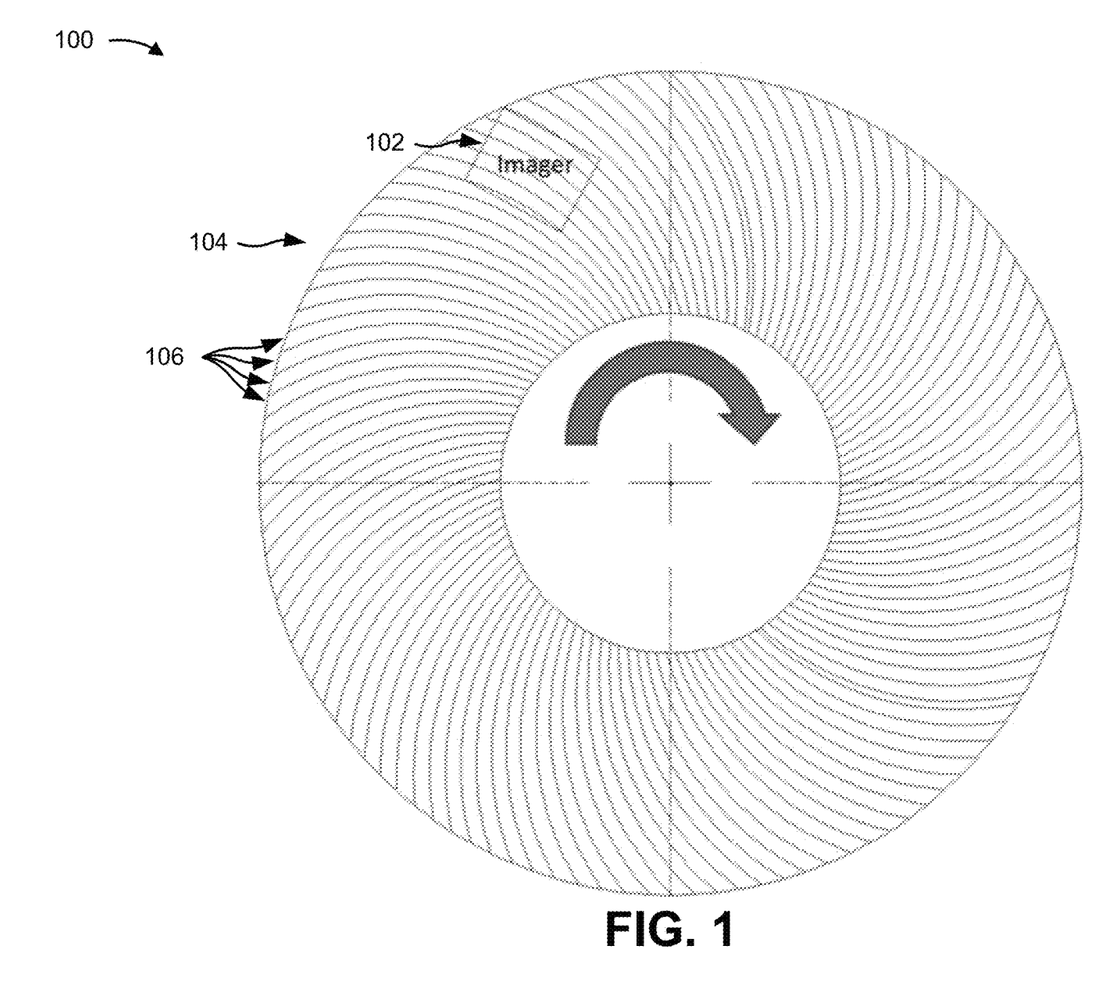
FIGS. 1-4 are diagrams of example implementations of optical devices including imagers and filter wheels described herein.

FIG. 1 is a diagram of an example implementation 100 of an optical device including an imager 102 and a filter wheel 104 described herein. As shown in FIG. 1, the filter wheel 104 may be positioned in front of the imager 102 such that light incident on the imager 102 passes through the filter wheel 104.

In some implementations, the imager 102 may be a camera sensor, a charged coupled device (CCD) sensor, and/or the like. Additionally, or alternatively, the imager 102 may include a two-dimensional (2D) array of pixels including multiple rows of pixels, a scanning linear array of pixels, and/or the like. In some implementations, and as further described herein with respect to FIG. 3, the optical device (e.g., using the imager 102) may capture an image or a plurality of images in a rolling shutter mode by sequentially exposing, at a shutter speed, each row of pixels of the array. Additionally, or alternatively, the optical device (e.g., using the imager 102) may capture an image or a plurality of images in a global shutter mode by simultaneously exposing pixels of the array (e.g., all pixels of the array).

In some implementations, the imager 102 may include one or more types of sensors (e.g., for capturing images at different wavelengths and/or in different spectral regions). For example, the imager 102 may include a silicon-based sensor, an indium-gallium-arsenide (InGaAs)-based sensor, a lead-salt-based sensor (e.g., a lead selenide (PbSe) sensor), and/or the like.

In some implementations, and as shown in FIG. 1, the filter wheel 104 may include a plurality of filter segments 106 (e.g., at least 100 filter segments and/or the like). For example, the filter wheel 104 may include 125 filter segments 106 as shown in FIG. 1. In some implementations, the filter segments 106 may be deposited (e.g., using binary multispectral (BMS) filter technology and/or the like) onto a disk to form the filter wheel 104. Additionally, or alternatively, the filter segments 106 of the filter wheel 104 may form a hyperspectral filter array.

Figure 3:
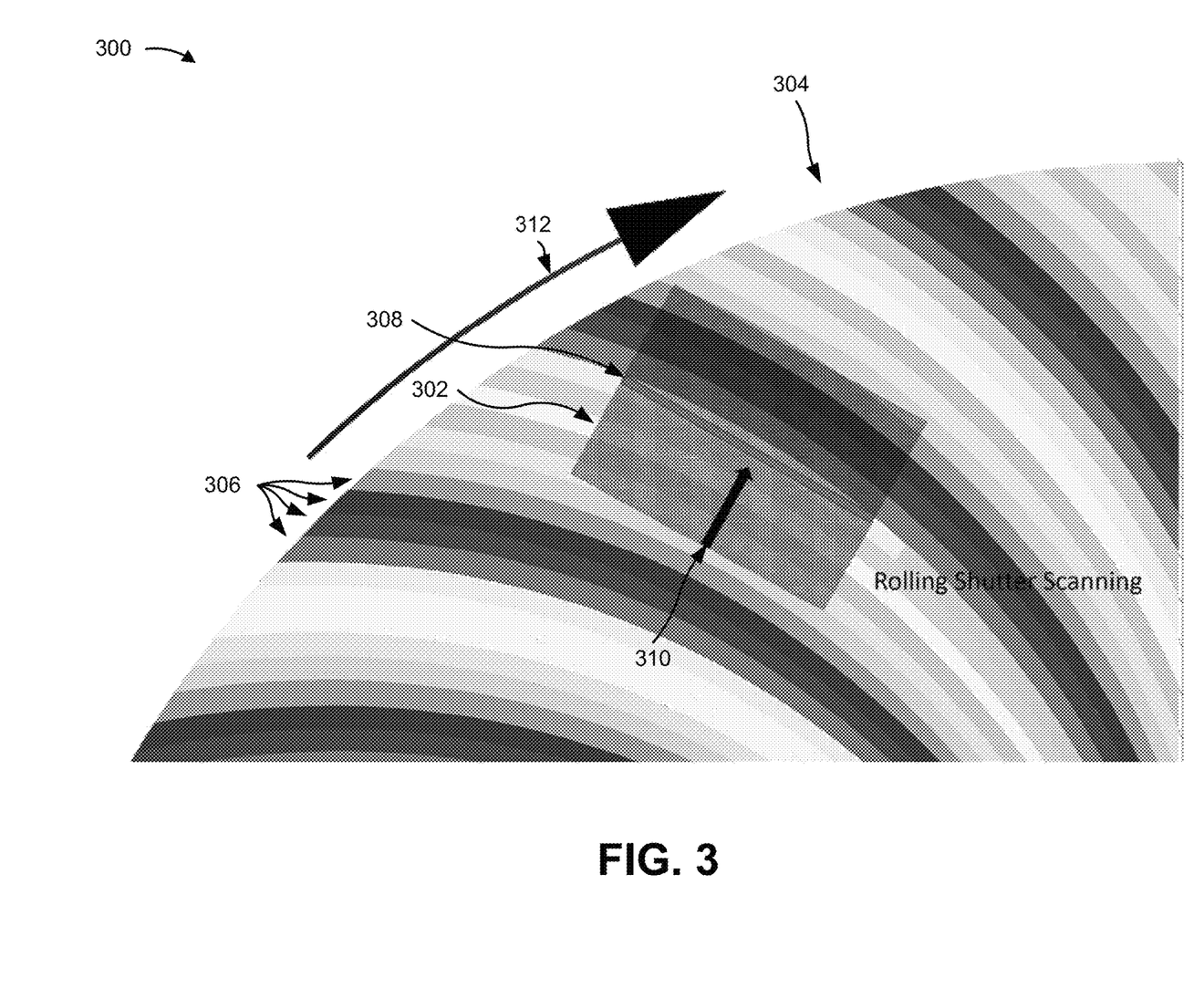

In some implementations, and as further described herein with respect to FIG. 3, the filter segments 106 may be different types of filters and may be positioned in the filter wheel 104 in a repeating sequence. For example, each filter segment in the repeating sequence of filter segments 106 may be a different type of filter segment from other filter segments 106 in the repeating sequence of filter segments 106. Additionally, or alternatively, each filter segment in the repeating sequence of filter segments 106 may pass a different wavelength range from wavelength ranges passed by other filter segments 106 in the repeating sequence of filter segments 106. In some implementations, the repeating sequence of filter segments 106 may include at least six different types of filter segments 106, filter segments 106 that pass at least six different wavelength ranges, and/or the like.

Figure 4:
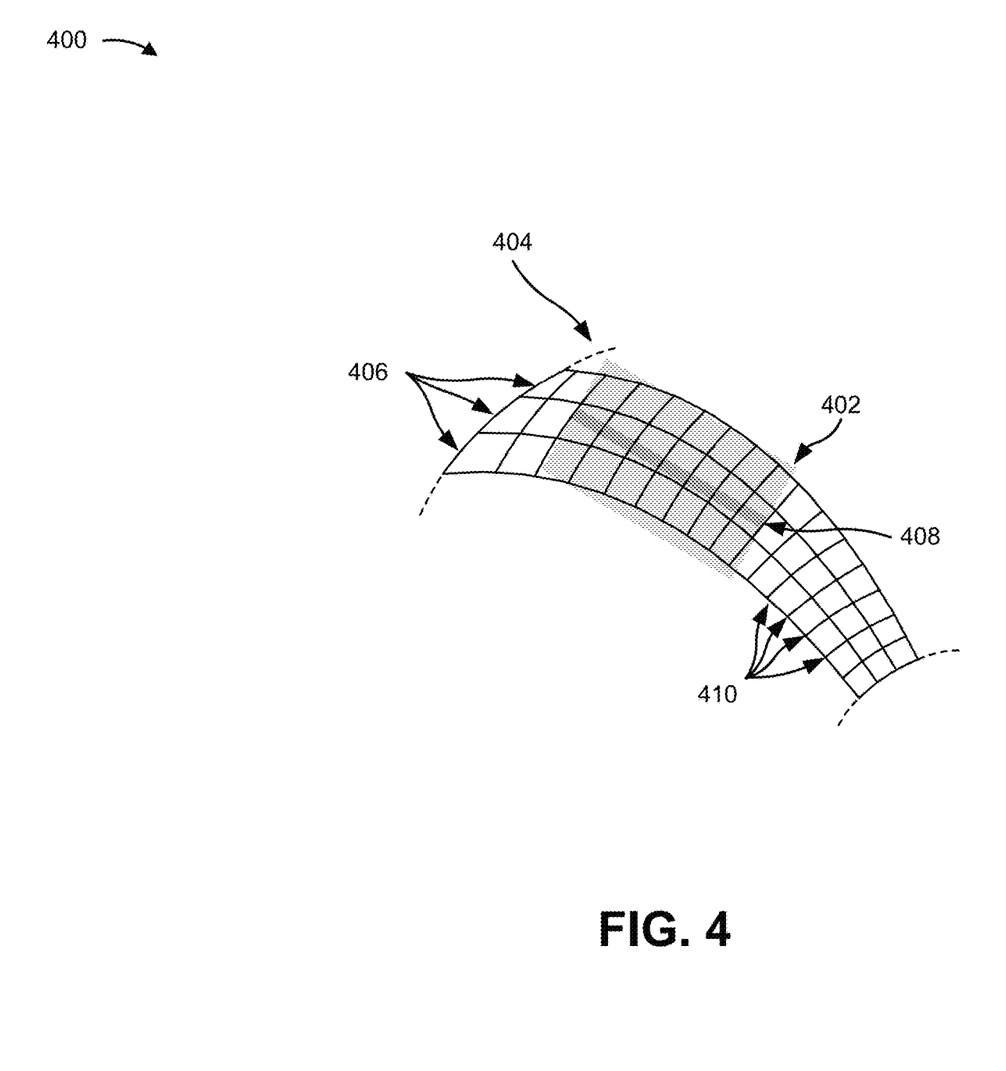

In some implementations, and as further described herein with respect to FIG. 4, one or more of the filter segments 106 may include subsegments positioned in a column along a length of the one or more filter segments. For example, a filter segment may include subsegments, and each subsegment may be a different type of filter from other subsegments in the filter segment, may pass a different wavelength range from wavelength ranges passed by other subsegments in the filter segment, and/or the like.

As shown in FIG. 1, a portion of the filter wheel 104 in front of the imager 102 may include two or more filter segments 106. For example, the portion of the filter wheel 104 in front of the imager 102 may include at least five filter segments, as shown in FIG. 1. In some implementations, the filter segments 106 may have segment widths that are less than a dimension (e.g., a length and/or a width) of the array of pixels in the imager 102. Additionally, or alternatively, and as described further herein with respect to FIG. 3, the rows of pixels in the array of the imager 102 may have row widths, and the filter segments 106 may have segment widths greater than or equal to the row widths. For example, portions of the filter segments 106 positioned in front of the array of the imager 102 may have a segment width greater than or equal to the row width.

In some implementations, the optical device may include one or more lens elements. For example, the optical device may include a lens to optimize ray angles for performance. Additionally, or alternatively, the optical device may include a lens and, using a focal speed of the lens, may vary a full-width half-maximum (FWHM) of the filter segments 106.

As also shown by the curved arrow in FIG. 1, the optical device may spin the filter wheel 104 around an axis (e.g., at a wheel speed). For example, the optical device may include a motor to spin the filter wheel 104. In some implementations, the optical device may spin the filter wheel 104 while capturing (e.g., using the imager 102) one or more images. For example, the optical device may capture a plurality of images by sequentially exposing, at a shutter speed and in a rolling shutter mode, each row of pixels of the array, and, while capturing the plurality of images, may spin the filter wheel 104 at a wheel speed. In some implementations, the spinning filter wheel 104 may not generate mechanical vibrations. In this way, the filter wheel 104 may be a scrolling hyperspectral synthesizer.

In some implementations, the optical device may control the wheel speed to correspond to the shutter speed such that, for an image of the plurality of images, a single filter segment of the filter segments 106 is positioned in front of each exposed row of pixels. Additionally, or alternatively, the optical device may control the wheel speed and/or the shutter speed such that each pixel of the array is exposed to each type of filter segment at least once and may generate, for each type of filter segment, an image at a highest spatial resolution of the imager 102.

In some implementations, the optical device and/or the imager 102 may include a curtain shutter, positioned between the array of pixels and the filter wheel 104, to block light from a subset of filter segments 106 of the filter wheel 104 (e.g., from being captured by the pixels before readout). For example, in a rolling shutter mode and when a single filter segment of the filter segments 106 is positioned in front of each exposed row of pixels, the curtain shutter may block light from passing through filter segments 106 other than the single filter segment to the array of pixels. Additionally, or alternatively, the optical device and/or the imager 102 may reset the pixels (e.g., before exposing the pixels) to clear light captured by the pixels from filter segments 106 other than the single filter segment (e.g., the filter segment of interest).

In some implementations, the optical device may control the wheel speed and/or the shutter speed such that the wheel speed and the shutter speed do not correspond. For example, the optical device may control the wheel speed such that the filter wheel 104 is timed to position many different types of filter segments 106 in front of exposed pixel rows (e.g., as exposed pixel rows integrate light and are read out). In some implementations, controlling the wheel speed and/or the shutter speed in this manner permits the optical device to select any combination of types of filter segments.

In some implementations, the optical device may use an averaging technique to minimize sensor noise by recording and averaging multiple scans (e.g., images) for each type of filter segment, to generate a composite image for each type of filter segment. For example, each pixel of the imager 102 may be a spectrometer with a spectral resolution defined by a quantity of types of filter segments in the filter wheel 104.

In some implementations, if the filter segments 106 include RGB filters, the optical device may combine RGB filter output from the pixels of the imager 102 to generate a high-definition image (e.g., a high spatial resolution image) of a field of view of the imager 102. For example, the filter segments 106 may include eight types of filters having different spectral bandpass widths, and the optical device may generate color-rich images with high spatial resolution (e.g., a maximum spatial resolution of the imager 102 and/or the like). In some implementations, the imager 102 may not require ultraviolet (UV) and/or infrared (IR) filtering (e.g., as required by conventional digital single-lens reflex (DSLR) cameras) because the spinning filter segments 106 may mitigate impacts of UV and/or IR light. Additionally, or alternatively, the spinning filter wheel 104 may not generate or may generate fewer mechanical vibrations (e.g., as compared to a linearly scrolling assembly of filters), which may permit the optical device to generate high-definition video with high spectral resolution.

In some implementations, the optical device may use output from the pixels of the imager 102 to generate relative spectral scans (e.g., if bright and dark reference images are generated and/or the like). Additionally, or alternatively, the optical device may provide (e.g., output, display, cause to be displayed, and/or the like) spectral content for a region of interest (ROI) in a high spatial resolution image (e.g., in response to user input identifying the ROI and/or the like).

In some implementations, a spectral resolution of the optical device may be adjusted, based on an application of the optical device, by changing the quantity of filter segments 106 and/or the quantity of different types of filter segments 106 on the filter wheel 104. For example, the optical device may be included in and/or attached to an unmanned aerial vehicle (e.g., a drone), and the filter wheel 104 may include fewer filter segments 106 and/or types of filter segments 106 (e.g., as compared to other applications) to provide 4K, 8K, and/or 16K spatial resolution with each pixel of the imager 102 acting as a spectrometer and/or with color-rich images and/or video. In some implementations, the spectral resolution of the optical device may be adjusted for applications such as agriculture, pharmaceutical, military, health care, and/or the like.

In some implementations, the optical device may be configured (e.g., based on user input and/or the like) to capture one or more images of an object in one narrow spectral bandwidth (e.g., using one type of filter segment in the filter wheel 104) and/or in a few narrow spectral bandwidths (e.g., using a few types of filter segments 106 in the filter wheel 104). In other words, the optical device may be configured to change spectral schemes (e.g., which type of spectral filters are used) for capturing images and/or video based on an application, based on user input, and/or the like. For example, a user may select an ROI for spectral analysis by the optical device, and the optical device may, based on the selection, control the imager 102 (e.g., by adjusting the shutter speed, shutter timing, and/or the like) and/or the filter wheel 104 (e.g., by adjusting the wheel speed, position of the filter wheel 104, and/or the like).

As indicated above, FIG. 1 is provided as an example. Other examples may differ from what is described with regard to FIG. 1.

Figure 2:
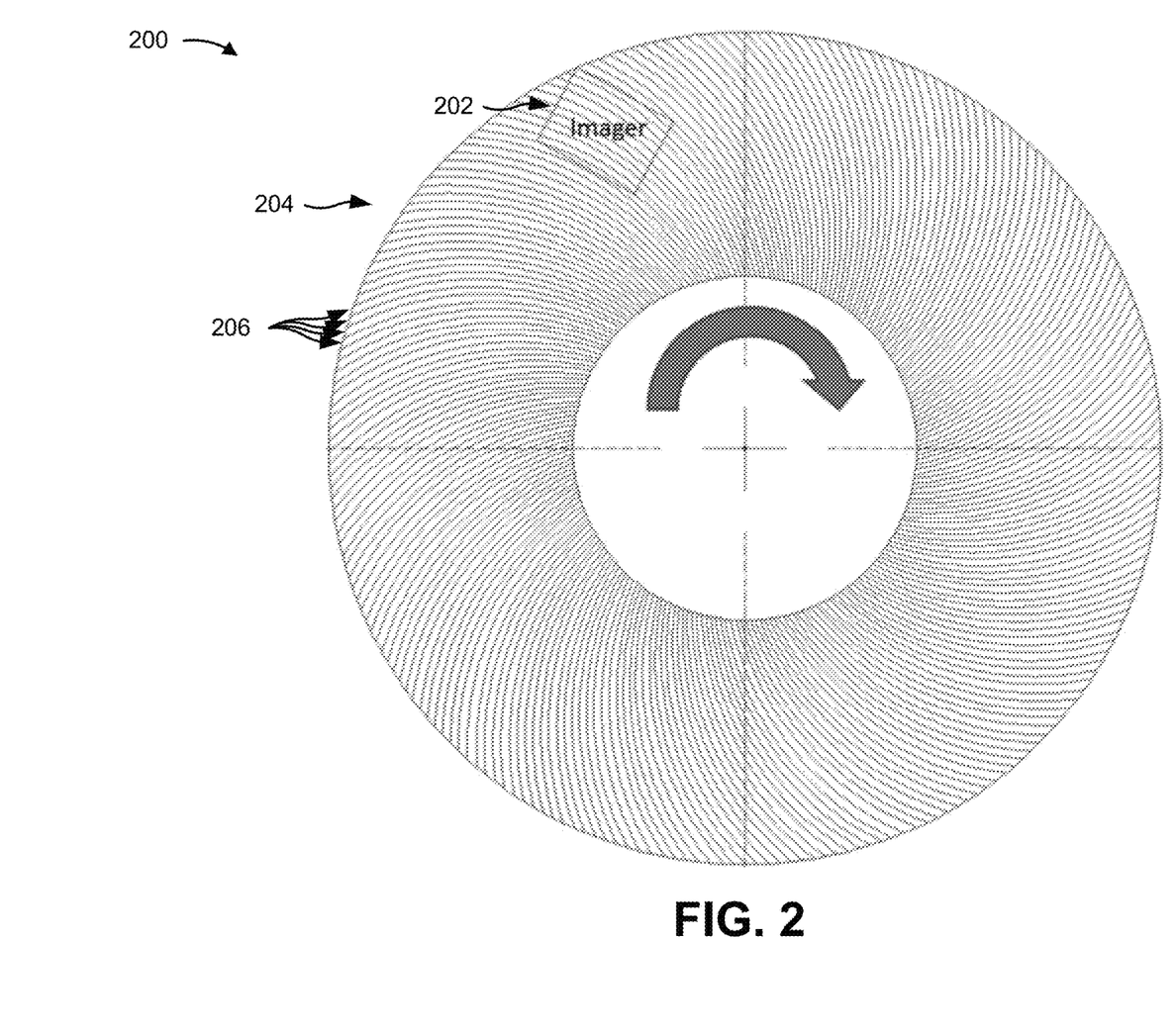

FIG. 2 is a diagram of an example implementation 200 of an optical device including an imager 202 and a filter wheel 204 described herein. As shown in FIG. 2, the filter wheel 204 may be positioned in front of the imager 202 such that light incident on the imager 202 passes through the filter wheel 204. As also shown in FIG. 2, the filter wheel 204 may include a plurality of filter segments 206.

In some implementations, the optical device, the imager 202, the filter wheel 204, and the filter segments 206 of example implementation 200 may be similar to the optical device, the imager 102, the filter wheel 104, and the filter segments 106 shown in and described with respect to example implementation 100 of FIG. 1. However, rather than the 125 filter segments 106 of the filter wheel 104 of example implementation 100, the filter wheel 204 of example implementation 200 may include 250 filter segments 206 as shown in FIG. 2.

As indicated above, FIG. 2 is provided as an example. Other examples may differ from what is described with regard to FIG. 2.

FIG. 3 is a diagram of an example implementation 300 of an optical device including an imager 302 and a filter wheel 304 described herein. As shown in FIG. 3, the filter wheel 304 may be positioned in front of the imager 302 such that light incident on the imager 302 passes through the filter wheel 304. As also shown in FIG. 3, the filter wheel 304 may include a plurality of filter segments 306.

In some implementations, the optical device, the imager 302, the filter wheel 304, and the filter segments 306 of example implementation 300 may be similar to the optical device, the imager 102, the filter wheel 104, and the filter segments 106 shown in and described with respect to example implementation 100 of FIG. 1. However, FIG. 3 shows a close-up view of a portion of the optical device including a portion of the filter wheel 304 positioned in front of the imager 302. As shown in FIG. 3, the imager 302 may include a 2D array of pixels including multiple rows of pixels including a row 308.

As shown by shading in FIG. 3, the filter wheel 304 may include a repeating sequence of filter segments 306, and each filter segment in the repeating sequence may be a different type of filter segment from other filter segments in the repeating sequence. For example, and as shown in FIG. 3, the repeating sequence may include ten different types of filter segments 306. In some implementations, the different types of filter segments 306 may have different spectral properties and/or may have different narrow spectral bandpass widths to generate spectral content for each pixel of the imager 302.

As shown in FIG. 3, the filter segments 306 may have segment widths that are less than a dimension (e.g., a length and/or a width) of the array of pixels in the imager 302. In some implementations, and as shown in FIG. 3 with respect to the row 308, the rows of pixels in the array may have row widths, and the filter segments 306 may have segment widths greater than or equal to the row widths. Additionally, or alternatively, the filter segments 306 may have a segment width and/or a segment shape such that a row (e.g., the row 308) of the pixels may be positioned under a portion of only one filter segment (e.g., during image capture in the rolling shutter mode). For example, portions of the filter segments 306 positioned in front of the array of the imager 302 may have a segment width greater than or equal to the row width.

In some implementations, the optical device (e.g., using the imager 302) may capture an image or a plurality of images in a rolling shutter mode by sequentially exposing, at a shutter speed, each row of pixels of the array. In this regard, the row 308 may be the row of pixels of the array being exposed at a given moment in time during image capture in the rolling shutter mode. As shown by arrow 310 on the imager 302 in FIG. 3, each row may be sequentially exposed, at the shutter speed, from a first side of the array to a second side of the array opposite the first side. As shown by arrow 312 in FIG. 3, the optical device may spin the filter wheel 304, at a wheel speed, in a clockwise direction such that the filter segments 306 pass over the imager 302 from the first side of the array to the second side of the array.

In some implementations, the optical device may control the wheel speed and/or the shutter speed such that, for an image, a single filter segment of the filter segments 306 is positioned in front of each exposed row of pixels. For example, as the row being exposed changes from the first side of the array to the second side of the array during a rolling shutter scan, the filter wheel 304 may spin at a wheel speed such that a single filter segment moves from the first side of the array to the second side of the array at the same speed that the row being exposed changes. Stated differently, the single filter segment may move in unison with a rolling shutter scan. Additionally, or alternatively, the optical device may control the wheel speed and/or the shutter speed such that each pixel of the array views each type of filter segment at least once and may generate, for each type of filter segment, an image at a highest spatial resolution of the imager 302.

As indicated above, FIG. 3 is provided as an example. Other examples may differ from what is described with regard to FIG. 3.

FIG. 4 is a diagram of an example implementation 400 of an optical device including an imager 402 and a filter wheel 404 described herein. As shown in FIG. 4, the filter wheel 404 may be positioned in front of the imager 402 such that light incident on the imager 402 passes through the filter wheel 404. As also shown in FIG. 4, the filter wheel 404 may include a plurality of filter segments 406. Although FIG. 4 only shows three filter segments, the filter wheel 404 may include additional filter segments, as indicated by the dashed lines.

In some implementations, the optical device, the imager 402, the filter wheel 404, and the filter segments 406 of example implementation 400 may be similar to the optical device, the imager 102, the filter wheel 104, and the filter segments 106 shown in and described with respect to example implementation 100 of FIG. 1. However, FIG. 4 shows a close-up view of a portion of the optical device including a portion of the filter wheel 404 positioned in front of the imager 402. As shown in FIG. 4, the imager 402 may include a 2D array of pixels including multiple rows of pixels including a row 408.

As shown in FIG. 4, the filter segments 406 may include subsegments 410 positioned in a column along a length of the one or more filter segments 406. For example, a filter segment may include subsegments 410, and each subsegment may be a different type of filter from other subsegments 410 in the filter segment, may pass a different wavelength range from other subsegments 410 in the filter segment, and/or the like. In some implementations, the filter segments 406 may provide vertical filter lines on the filter wheel 404 (e.g., lines extending generally outward from a center of the filter wheel 404 to an outer circumference of the filter wheel 404), and the subsegments 410 may provide lateral filter lines on the filter wheel 404. In this way, the filter wheel 404 may filter light incident on the imager 402, where the filtering varies in two directions.

As shown in FIG. 4, the filter segments 406 may have a shape and/or a size such that a row (e.g., the row 408) of the pixels may be positioned under a portion of only one filter segment (e.g., during image capture in the rolling shutter mode). As also shown in FIG. 4, the subsegments 410 may have a shape and/or a size in the filter segments 406 such that a row (e.g., the row 408) of the pixels may be subdivided by the subsegments 410 into sub-rows. For example, the subsegments 410 may have a shape and/or a size such that borders of the subsegments 410 are perpendicular to the row 408. In some implementations, the subsegments 410 may subdivide the sub-rows into sub-rows having a same quantity of pixels.

As indicated above, FIG. 4 is provided as an example. Other examples may differ from what is described with regard to FIG. 4.

Figure 5:
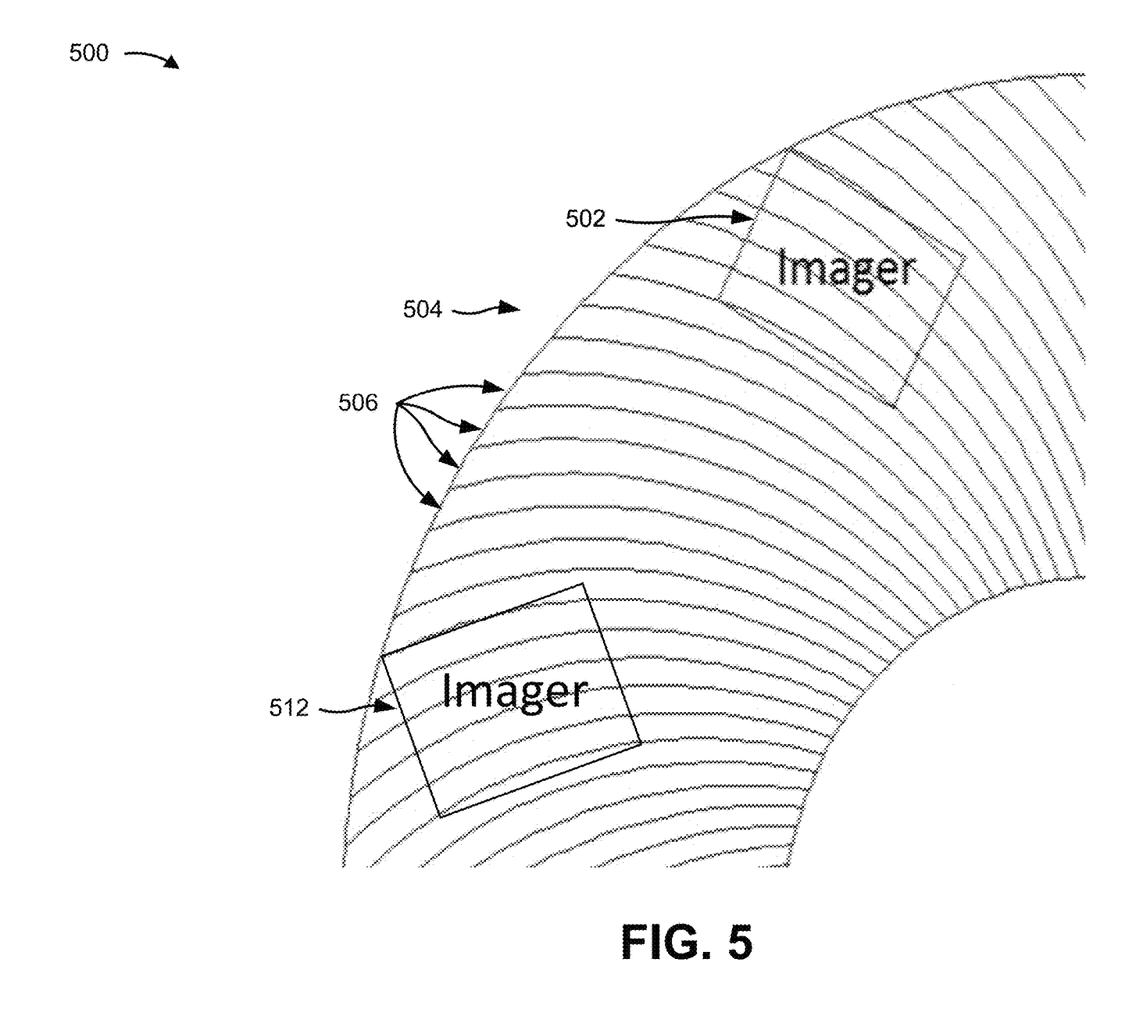
FIG. 5 is a diagram of an example implementation of an optical device including multiple imagers and a filter wheel described herein.

FIG. 5 is a diagram of an example implementation 500 of an optical device including multiple imagers 502 and 512 and a filter wheel 504 described herein. As shown in FIG. 5, the filter wheel 504 may be positioned in front of the imagers 502 and 512 such that light incident on the imagers 502 and 512 passes through the filter wheel 504. As also shown in FIG. 5, the filter wheel 504 may include a plurality of filter segments 506.

In some implementations, the optical device, the imagers 502 and 512, the filter wheel 504, and the filter segments 506 of example implementation 500 may be similar to the optical device, the imager 102, the filter wheel 104, and the filter segments 106 shown in and described with respect to example implementation 100 of FIG. 1. However, FIG. 5 shows a close-up view of a portion of the optical device including a portion of the filter wheel 504 positioned in front of the imagers 502 and 512.

In some implementations, the imagers 502 and 512 may be a same type of imager. For example, the imagers 502 and 512 may both be CCD sensors. In some implementations, including two or more imagers (e.g., imagers 502 and 512) may reduce a demand placed on a single imager. Additionally, or alternatively, the optical device may use multiple imagers to generate three-dimensional images and/or video having high spatial resolution and high spectral resolution.

In some implementations, the imagers 502 and 512 may be different types of imager. For example, imager 502 may be a silicon-based sensor for capturing images in visible wavelengths, and imager 512 may be a PbSe sensor for capturing images in infrared wavelengths.

In some implementations, the optical device may include more than two imagers. For example, the optical device may include a first pair of imagers and a second pair of imagers. In such an example, a first portion of the filter wheel (e.g., an upper left portion of the filter wheel as shown in FIG. 5) may be positioned in front of the first pair of imagers, and a second portion of the filter wheel (e.g., a lower right portion of the filter wheel) may be positioned in front of the second pair of imagers. In some implementations, each of the first pair of imagers and the second pair of imagers may include a silicon-based sensor and a PbSe sensor, which may enable the optical device (e.g., using image rotating software and/or the like) to generate three-dimensional images and/or video having high spatial resolution and high spectral resolution.

As indicated above, FIG. 5 is provided as an example. Other examples may differ from what is described with regard to FIG. 5.

Figure 6:
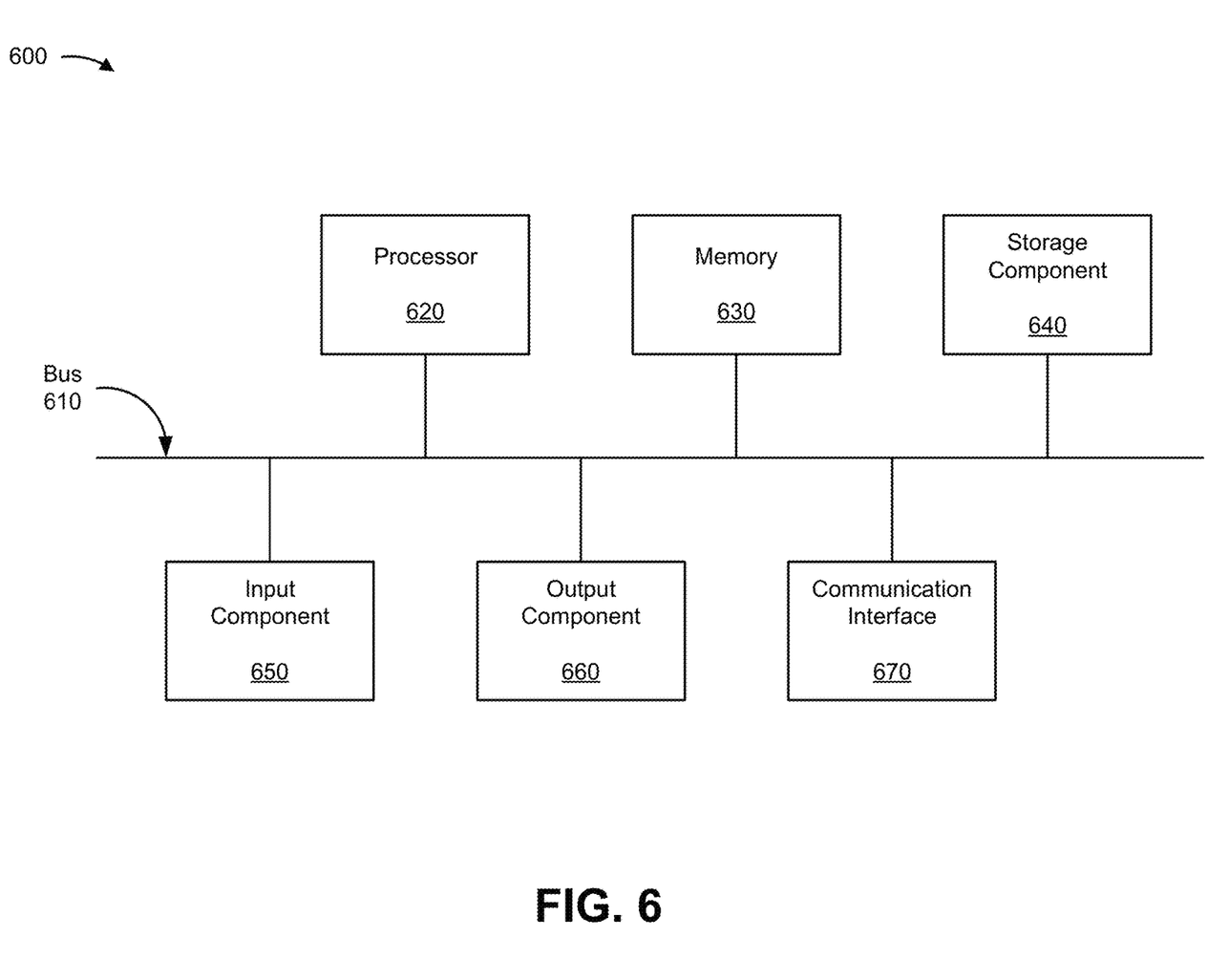
FIG. 6 is a diagram of example components of one or more optical devices of FIGS. 1-5.

FIG. 6 is a diagram of example components of a device 600, which may correspond to the optical devices of example implementations 100, 200, 300, 400, and/or 500. In some implementations, the optical devices of example implementations 100, 200, 300, 400, and/or 500 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory), a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, an actuator, and/or the like. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, an antenna, and/or the like.

Device 600 may perform one or more processes described herein. For example, a non-transitory computer-readable medium (e.g., memory 630 and/or storage component 640) may store a set of instructions (e.g., one or more instructions, code, software code, program code, and/or the like) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
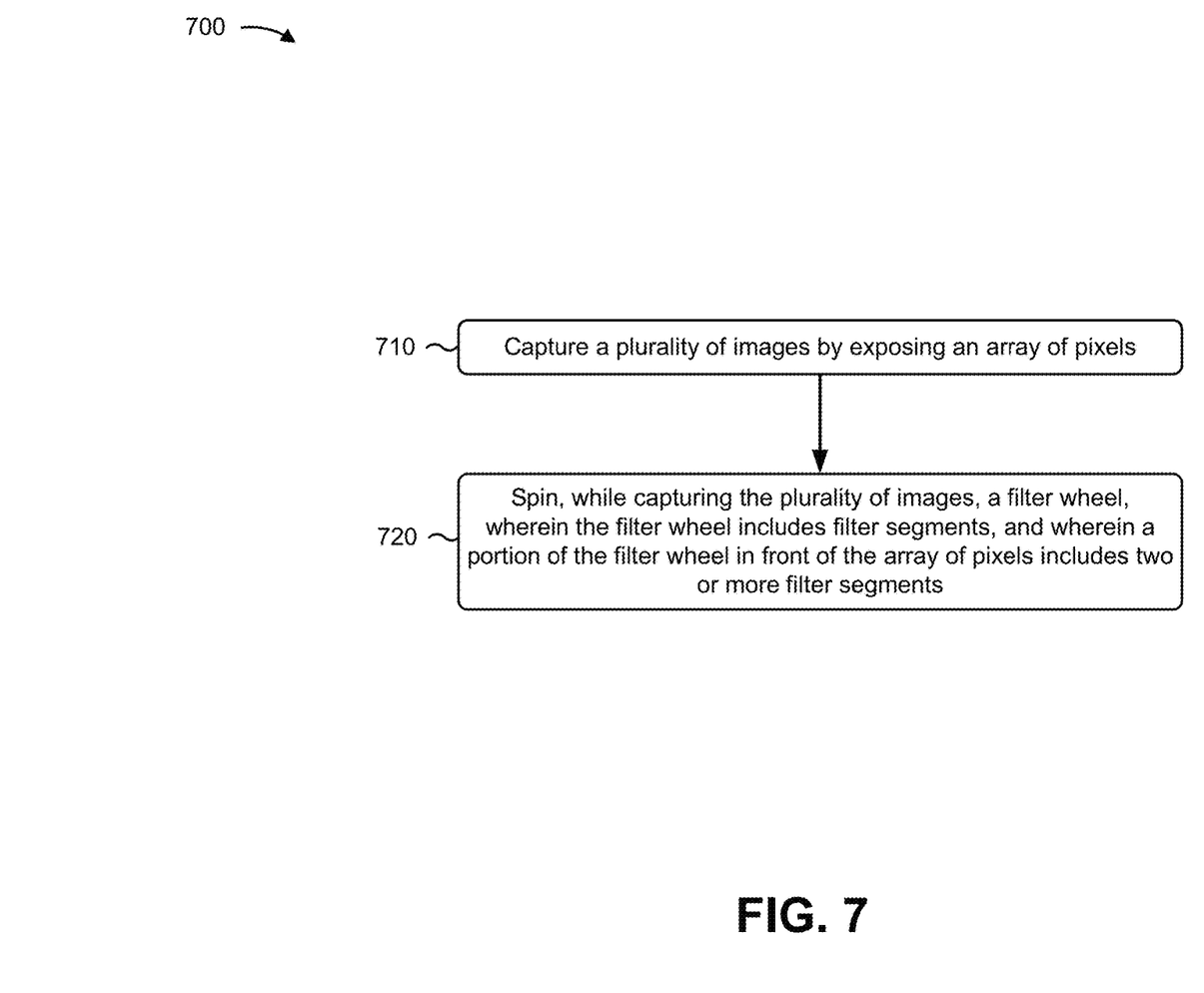
FIGS. 7-8 are flow charts of example processes relating to capturing images with an optical device including a filter wheel.

FIG. 7 is a flow chart of an example process 700 relating to capturing images with an optical device including a filter wheel. In some implementations, one or more process blocks of FIG. 7 may be performed by an optical device (e.g., the optical devices of example implementations 100, 200, 300, 400, and/or 500). Additionally, or alternatively, one or more process blocks of FIG. 7 may be performed by one or more components of a device 600, such as processor 620, memory 630, storage component 640, input component 650, output component 660, communication component 670, and/or the like.

As shown in FIG. 7, process 700 may include capturing a plurality of images by exposing an array of pixels (block 710). For example, the optical device may capture a plurality of images by exposing an array of pixels, as described above. In some implementations, the optical device may include the array of pixels and a filter wheel.

As further shown in FIG. 7, process 700 may include spinning, while capturing the plurality of images, a filter wheel, wherein the filter wheel includes filter segments, and wherein a portion of the filter wheel in front of the array of pixels includes two or more filter segments (block 720). For example, the optical device may spin, while capturing the plurality of images, the filter wheel, as described above. In some implementations, the filter wheel includes filter segments. In some implementations, a portion of the filter wheel in front of the array of pixels includes two or more filter segments.

Process 700 may include additional implementations, such as any single implementation or any combination of implementations described below and/or in connection with one or more other processes described elsewhere herein.

In a first implementation, the array of pixels includes rows of pixels, and capturing the plurality of images by exposing the array of pixels comprises sequentially exposing, at a shutter speed and in a rolling shutter mode, each row of pixels of the array of pixels.

In a second implementation, alone or in combination with the first implementation, capturing the plurality of images by exposing the array of pixels comprises simultaneously exposing, in a global shutter mode, pixels of the array of pixels.

In a third implementation, alone or in combination with one or more of the first and second implementations, the filter wheel includes a repeating sequence of filter segments, and each filter segment in the repeating sequence of filter segments is a different type of filter segment from other filter segments in the repeating sequence of filter segments.

In a fourth implementation, alone or in combination with one or more of the first through third implementations, the array of pixels is a first array of pixels, the plurality of images is a first plurality of images, the portion of the filter wheel in front of the first array of pixels is a first portion, the device includes a second array of pixels, and a second portion of the filter wheel in front of the second array of pixels includes two or more filter segments.

In a fifth implementation, alone or in combination with one or more of the first through fourth implementations, process 700 includes capturing, while capturing the first plurality of images and while spinning the filter wheel, a second plurality of images by exposing the second array of pixels.

In a sixth implementation, alone or in combination with one or more of the first through fifth implementations, process 700 includes generating, based on the first plurality of images and the second plurality of images, at least one of a three-dimensional image or a three-dimensional video.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
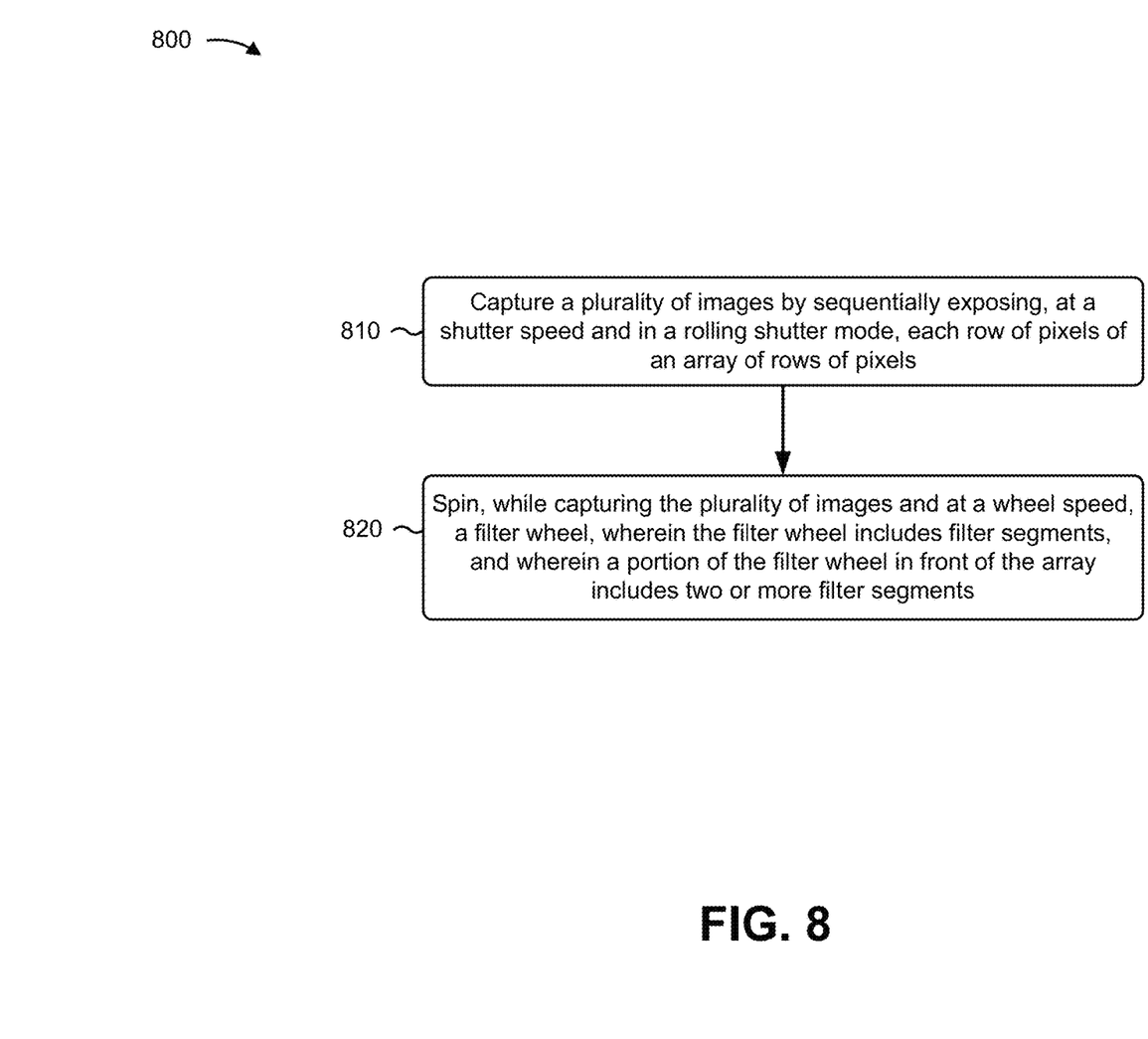

FIG. 8 is a flow chart of an example process 800 relating to capturing images with an optical device including a filter wheel. In some implementations, one or more process blocks of FIG. 8 may be performed by an optical device (e.g., the optical devices of example implementations 100, 200, 300, 400, and/or 500). Additionally, or alternatively, one or more process blocks of FIG. 7 may be performed by one or more components of a device 600, such as processor 620, memory 630, storage component 640, input component 650, output component 660, communication component 670, and/or the like.

As shown in FIG. 8, process 800 may include capturing a plurality of images by sequentially exposing, at a shutter speed and in a rolling shutter mode, each row of pixels of an array of rows of pixels (block 810). For example, the optical device may capture a plurality of images by sequentially exposing, at a shutter speed and in a rolling shutter mode, each row of pixels of an array of rows of pixels, as described above. In some implementations, the optical device may include the array of rows of pixels and a filter wheel.

As further shown in FIG. 8, process 800 may include spinning, while capturing the plurality of images and at a wheel speed, a filter wheel, wherein the filter wheel includes filter segments, and wherein a portion of the filter wheel in front of the array includes two or more filter segments (block 820). For example, the optical device may spin, while capturing the plurality of images and at a wheel speed, a filter wheel, as described above. In some implementations, the filter wheel includes filter segments. In some implementations, a portion of the filter wheel in front of the array includes two or more filter segments.

Process 800 may include additional implementations, such as any single implementation or any combination of implementations described below and/or in connection with one or more other processes described elsewhere herein.

In a first implementation, the wheel speed corresponds to the shutter speed such that, for an image of the plurality of images, a single filter segment of the filter segments is positioned in front of each exposed row of pixels.

In a second implementation, alone or in combination with the first implementation, process 800 includes blocking light from filter segments other than the single filter segment.

In a third implementation, alone or in combination with one or more of the first and second implementations, process 800 includes, before exposing a row of pixels, resetting pixels of the row of pixels.

In a fourth implementation, alone or in combination with one or more of the first through third implementations, process 800 includes capturing multiple images with a single type of filter segment positioned in front of each exposed row of pixels and combining the multiple images of the plurality of images, by mathematical transform (e.g., averaging and/or the like) of pixel values of the multiple images, to generate a composite image.

In a fifth implementation, alone or in combination with one or more of the first through fourth implementations, spinning the filter wheel comprises spinning the filter wheel at the wheel speed such that multiple filter segments of the filter segments are positioned in front of each exposed row.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Although the descriptions of the above implementations include an optical device including one or more imagers and a filter wheel, some implementations may include an attachment device (e.g., a sled device and/or the like) for attaching to an optical device, an imaging system, and/or the like, where the attachment device includes a filter wheel similar to one or more of the filter wheels described with respect to the above implementations. For example, a sled device for attaching to and/or receiving a user device (e.g., a communication and/or computing device, a mobile phone, a smart phone, a laptop computer, a tablet computer, a handheld computer, a desktop computer, a gaming device, a wearable communication device, a smart wristwatch, a pair of smart eyeglasses, and/or the like) may include a filter wheel such that the filter wheel is positioned in front of a camera of the user device. In some implementations, the filter wheel may include a syncing filter segment (e.g., a dark filter segment and/or the like), and the user device may be configured (e.g., by an application, by the sled device, and/or the like) to detect the syncing filter segment and synchronize a shutter speed of the camera based on the syncing filter segment (e.g., to control the shutter speed based on a wheel speed and/or the like). Additionally, or alternatively, the sled device may communicatively connect to the user device (e.g., via a wired connection and/or a wireless connection, such as a Bluetooth connection, a Wi-Fi connection, a cellular connection, an NFC connection, and/or the like), and may, via the connection, provide to and/or receive from the user device information (e.g., a shutter speed of the camera, a wheel speed, and/or the like), commands (e.g., command signals to use a shutter speed for the camera, command signals to spin the filter wheel at a wheel speed, command signals to stop spinning the filter wheel, and/or the like), and/or the like. In some implementations, one or more filters (e.g., RGB filters, Bayer filters, and/or the like) employed by the camera of the user device may support one or more filter segments of the filter wheel.

The foregoing disclosure provides illustration and description, but is not intended to be exhaustive or to limit the implementations to the precise form disclosed. Modifications and variations may be made in light of the above disclosure or may be acquired from practice of the implementations.

The foregoing disclosure uses a spectrometer as an example, however, the calibration principles, procedures, and methods described herein may be used with any sensor, including but not limited to other optical sensors and spectral sensors.

As used herein, the term "component" is intended to be broadly construed as hardware, firmware, or a combination of hardware and software.

It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A device, comprising:
   an imager; and
   a filter wheel that includes filter segments that form a hyperspectral filter array and are positioned in the filter wheel in a repeating sequence, wherein at least a portion of the filter wheel is positioned in front of the imager, and
   wherein the device is configured to spin the filter wheel in a manner that one or more filter segments, of the filter segments, pass over the imager.

2. The device of claim 1, wherein light incident on the imager passes through the filter wheel.

3. The device of claim 1, wherein the imager comprises a two-dimensional (2D) array of pixels that includes multiple rows of pixels.

4. The device of claim 1,
   wherein the repeating sequence includes a first filter segment of a first type and a second filter segment of a second type, and
   wherein the second type is different from the first type.

5. The device of claim 4, wherein the first filter segment of the first type and the second filter segment of the second type have one or more of different spectral properties or different narrow spectral bandpass widths.

6. The device of claim 1, wherein the repeating sequence includes ten different types of filter segments.

7. The device of claim 1, wherein the one or more filter segments have segment widths that are less than one or more of a length or a width of an array of pixels in the imager.

8. The device of claim 1, wherein the one or more filter segments comprise segment widths greater than or equal to row widths of rows of pixels in the imager.

9. The device of claim 1, wherein the one or more filter segments includes a single filter segment that is positioned over in front of an exposed row of pixels in the imager.

10. The device of claim 1, wherein, when the device is configured to spin the filter wheel, the device is configured to control one or more of a wheel speed or a shutter speed.

11. The device of claim 1, wherein a quantity of the filter segments is 100 or more.

12. The device of claim 1, wherein the filter segments one or more of:
    include at least six different types of filter segments, or
    are configured to pass at least six different wavelength ranges.

13. A device, comprising:
    an imager; and
    a filter wheel including a plurality of filter segments positioned in the filter wheel,
      wherein at least a portion of the filter wheel is positioned in front of the imager,
      wherein the plurality of filter segments includes a filter segment,
      wherein the filter segment includes a first subsegment and a second subsegment positioned along a length of the filter segment, and
      wherein a first type of filter of the first subsegment is different from a second type of filter of the second subsegment.

14. The device of claim 13, wherein the first type of filter passes a first wavelength range that is different from a second wavelength range that is passed by the second type of filter.

15. The device of claim 13, wherein the plurality of filter segments provide vertical filter lines that extend generally outward from a center of the filter wheel to an outer circumference of the filter wheel.

16. The device of claim 13, wherein the first subsegment and the second subsegment provide lateral lines on the filter wheel.

17. A device, comprising:
    a plurality of imagers; and
    a filter wheel positioned in front of the plurality of imagers,
      wherein the filter wheel includes a hyperspectral synthesizer, and
      wherein the device is configured to spin the filter wheel in a manner that one or more filter segments, of the filter wheel, pass over at least one imager of the plurality of imagers.

18. The device of claim 17, wherein the plurality of imagers are charged couple device (CCD) sensors.

19. The device of claim 17, wherein the plurality of imagers include a first pair of imagers and a second pair of imagers,
    wherein a first portion of the filter wheel is positioned in front of the first pair of imagers, and
    wherein a second portion of the filter wheel is positioned in front of the second pair of imagers.

20. The device of claim 17, wherein the plurality of imagers include one or more of a silicon-based sensor, an indium-gallium-arsenide (InGaAs)-based sensor, or a lead-salt-based sensor.

* * * * *